(12) United States Patent
Grant et al.

(10) Patent No.: US 7,977,628 B2
(45) Date of Patent: Jul. 12, 2011

(54) SYSTEM AND METHOD FOR REDUCING PARTICLES AND CONTAMINATION BY MATCHING BEAM COMPLEMENTARY APERTURE SHAPES TO BEAM SHAPES

(75) Inventors: John Francis Grant, Beverly, MA (US); Patrick Richard Splinter, Middleton, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 374 days.

(21) Appl. No.: 12/146,122

(22) Filed: Jun. 25, 2008

(65) Prior Publication Data
US 2009/0321632 A1 Dec. 31, 2009

(51) Int. Cl.
*H01J 49/00* (2006.01)
(52) U.S. Cl. .................................. 250/288; 250/492.21
(58) Field of Classification Search ............. 250/492.21, 250/288
See application file for complete search history.

(56) References Cited

U.S. PATENT DOCUMENTS

| | | | |
|---|---|---|---|
| 4,578,589 A | 3/1986 | Aitken | |
| 4,943,728 A | 7/1990 | Dykstra et al. | |
| 5,306,920 A | 4/1994 | King et al. | |
| 5,311,028 A * | 5/1994 | Glavish | 250/492.21 |
| 5,932,882 A | 8/1999 | England et al. | |
| 5,959,305 A | 9/1999 | Mack et al. | |
| 5,969,366 A | 10/1999 | England et al. | |
| 6,753,539 B2 * | 6/2004 | Kawaguchi | 250/492.21 |
| 6,835,930 B2 | 12/2004 | Benveniste et al. | |
| 6,879,109 B2 | 4/2005 | Benveniste et al. | |
| 6,992,311 B1 | 1/2006 | Ring et al. | |
| 7,227,160 B1 | 6/2007 | Vanderberg et al. | |
| 7,885,032 B1 * | 2/2011 | Rahman et al. | 360/66 |

* cited by examiner

*Primary Examiner* — Phillip A Johnston
(74) *Attorney, Agent, or Firm* — Eschweiler & Associates, LLC

(57) ABSTRACT

An ion implantation system comprising an ion source configured to generate an ion beam along a beam path, a mass analyzer is located downstream of the ion source wherein the mass analyzer is configured to perform mass analysis of the ion beam and a beam complementary aperture located downstream of the mass analyzer and along the beam path, the beam complementary aperture having a size and shape corresponding to a cross-sectional beam envelope of the ion beam.

4 Claims, 7 Drawing Sheets

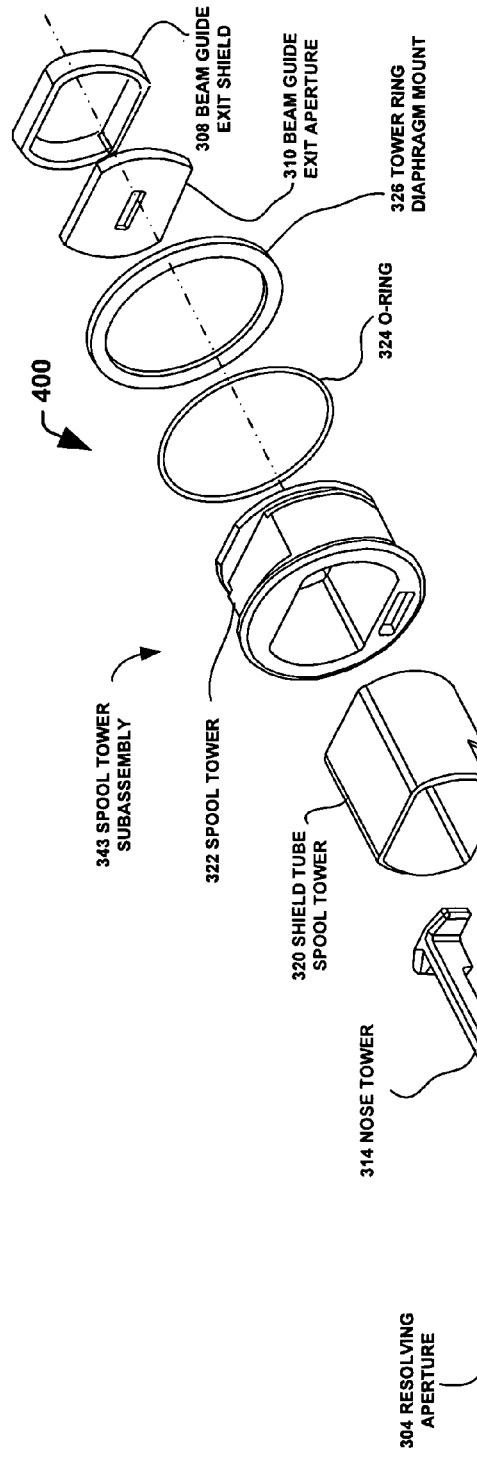
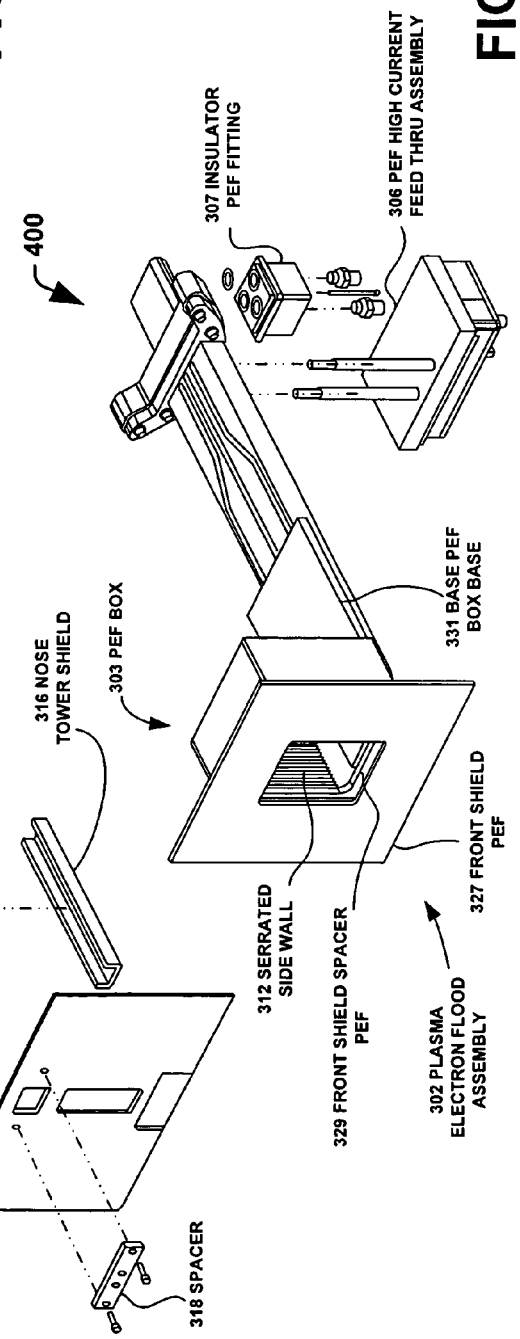
FIG. 4A
FIG. 4B

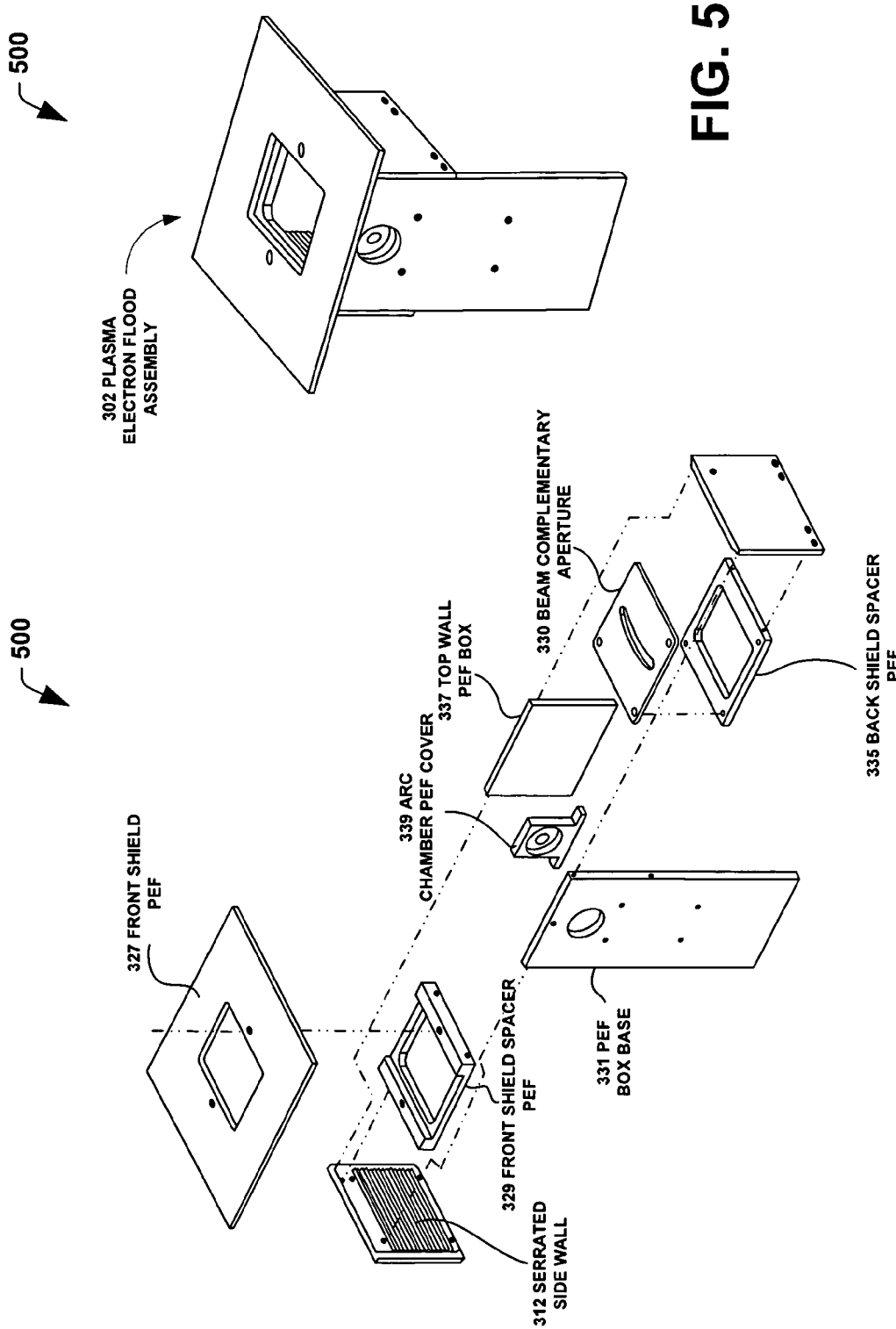

SYSTEM AND METHOD FOR REDUCING PARTICLES AND CONTAMINATION BY MATCHING BEAM COMPLEMENTARY APERTURE SHAPES TO BEAM SHAPES

FIELD OF THE INVENTION

The present invention relates generally to ion implantation systems, and more specifically to a system and method for reducing particles and contamination by matching beam defining aperture shapes to ion beam shapes in the ion implantation systems.

BACKGROUND OF THE INVENTION

In the manufacture of semiconductor devices, ion implantation is used to dope wafers and/or workpieces with impurities or dopants. Ion beam implanters are used to treat silicon workpieces with an ion beam, in order to produce n or p type extrinsic material or to form passivation layers during fabrication of an integrated circuit. When used for doping semiconductors, the ion beam implanter injects selected extrinsic ion specie to produce the desired semiconducting material. Implanting ions generated from source materials such as antimony, arsenic or phosphorus results in "n type" extrinsic material workpieces, whereas if "p type" extrinsic material workpieces are desired, ions generated from source materials such as boron, aluminum or gallium typically are implanted.

Ion implanters are also used in non-doping applications which may use ion beams of elements such as hydrogen or helium. An example of a non-doping application is wafer splitting which is enabled by creating a buried hydrogen layer in the silicon and then removing the top silicon layer in subsequent thermal processing steps. Typical hydrogen production ion implantation systems have unique parameters that separate them from the majority of implants performed in a standard high current implanter. One such parameter is the implant energy. As compared to typical high current implanters the energies are higher in order to produce a sufficiently deep implanted layer. Secondly, the dose requirements are higher than with typical implants in the range of $1\times10^{16}$ ions/cm$^2$ to $1\times10^{17}$ ions/cm$^2$. To support sufficiently high production output, the high doses require the implantation system to operate with 30 ma-60 ma of beam current, for example.

Traditional ion implantation equipment for semiconductor processing requires elemental mass selectivity in order to implant the desired specie into the workpiece and reduce the level of contamination resulting from other elements. The mass selectivity is accomplished with the use of electromagnets to bend the charged ion beam and then pass the beam through a mass selection resolving aperture. Together with the beam envelope and the electromagnets, the resolving aperture size and shape also determines the elemental resolving capability of the ion implanter. The size and shape of the aperture affects the selected mass resolution and cross-sectional envelope of the ion beam.

Typical high current implanters with horizontal dispersive planes are designed with rectangular resolving apertures which unevenly clip the ion beam. In conjunction with the mass analysis electromagnet, the width of the aperture typically defines the mass resolution of the system while the height of the aperture simply defines the maximum height of the beam at the workpiece target. Systems may be designed with additional beam forming and shaping apertures upstream or downstream of the resolving aperture which further define the final size of the ion beam at the workpiece. These apertures typically cause some uneven beam intercept as the beam passes through the openings.

Thus, there remains a need for improved systems and methods for reducing particles and contamination by matching beam defining aperture shapes to the ion beam shapes in the ion implantation systems.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

In accordance with one aspect of the invention an ion implantation system comprising an ion source configured to generate an ion beam along a beam path. A mass analyzer is located downstream of the ion source wherein the mass analyzer is configured to perform mass analysis of the ion beam. A beam complementary aperture is located downstream of the mass analyzer and along the beam path, wherein the beam complementary aperture has a size and shape corresponding to a cross-sectional beam envelope of the ion beam. In other words, the beam complementary aperture corresponds to the beam cross-sectional envelope or substantially matches the beam cross-section; wherein the plane of the beam complementary aperture is perpendicular to the ion beam path axis.

In accordance with another aspect of the present invention an ion implantation system comprises an ion source configured to generate an ion beam along a beam path. A mass analyzer is downstream of the ion source configured to mass analyze the beam. A resolving assembly is located downstream of the mass analyzer comprising a plasma electron flood assembly, a resolving aperture and at least one beam complementary aperture. The resolving assembly is configured to support the resolving aperture and the at least one beam complementary aperture at a specified distance. The resolving aperture is located downstream of the mass analyzer component, wherein the at least one beam complementary aperture is downstream from the resolving aperture along the beam path having a size and shape corresponding to a cross-sectional envelope of the ion beam.

In accordance with yet another aspect of the present invention a method of reducing particles and contamination by matching a beam complementary aperture with an ion beam cross-sectional size and shape. The method comprises (a) selecting ion beam source parameters, (b) selecting mass analyzer parameters including field strength and (c) selecting a resolving aperture position. Thereinafter the method comprises (d) determining cross-sectional envelop of ion beam at the location where the beam complementary aperture will be located, (e) fabricating the beam complementary aperture that approximates the cross-sectional envelop of ion beam and installing the beam complementary aperture, (f) measuring key ion beam factors, returning to (d) if the measured key ion beam factors are unacceptable and ending the method.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIGS. 4A and 4B are an exploded view and an assembly view of a portion of the resolving assembly in accordance with an aspect of the present invention;

FIGS. 5A and 5B are an exploded view and an assembly view of a PEF box assembly in accordance with an aspect of the present invention;

DETAILED DESCRIPTION OF THE INVENTION

Figure 1:
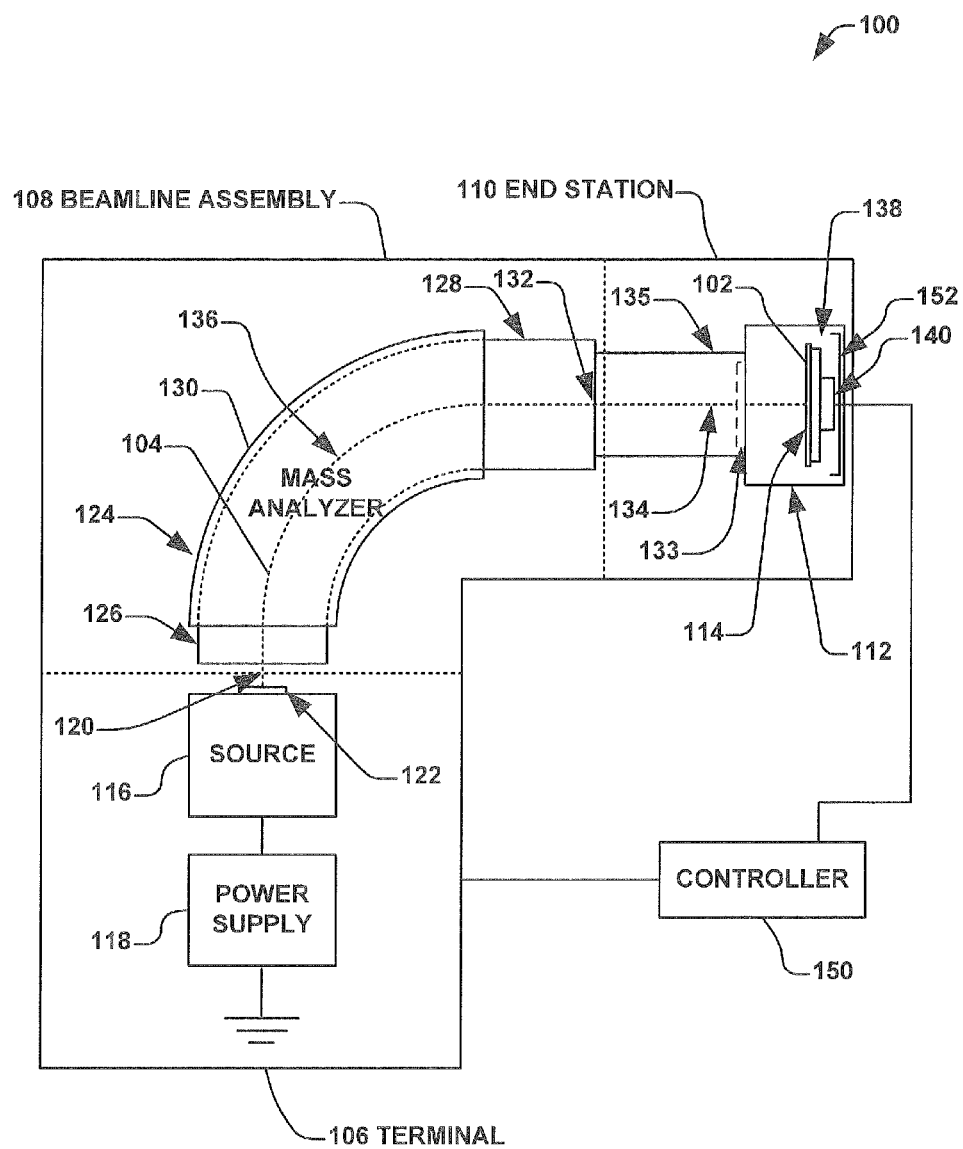
FIG. 1 illustrates an example ion implantation system in accordance with an aspect of the present invention.

The present invention will now be described with reference to the drawings wherein like reference numerals are used to refer to like elements throughout, and wherein the illustrated structures are not necessarily drawn to scale.

A system and method in accordance with the present invention for reducing particles and contamination by matching a beam complementary aperture to the actual measured/determined ion beam shape. In other words, the beam complementary aperture corresponds to the beam cross-sectional envelope or substantially matches the beam cross-section; wherein the plane of the beam complementary aperture is perpendicular to the ion beam path axis.

Now turning to FIG. 1, demonstrated is an example ion implantation system 100 in accordance with an aspect of the present invention for treatment of one or more workpieces. The system 100 makes use of a beam complementary aperture 133 and is presented for illustrative purposes and it is appreciated that aspects of the invention are not limited to the described ion implantation system 100 and that other suitable ion implantation systems of varied configurations can also be employed. It should be appreciated that the beam complementary aperture 133 is in addition to a resolving aperture 132 in this embodiment.

The ion implantation system 100 is operable to reciprocally scan a workpiece 102 (e.g., a semiconductor substrate, wafer and the like) relative to an ion beam 104, therein implanting ions into the workpiece 102. The ion implantation system 100, for example, is further controlled by a controller 150, wherein functionality of the ion implantation system and a workpiece scanning system 138 is controlled via the controller 150.

As stated above, various aspects of the present invention may be implemented in association with any type of ion implantation apparatus, including, but not limited to, the exemplary system 100 of FIG. 1. The exemplary ion implantation system 100 comprises a terminal 106, a beamline assembly 108, and an end station 110 that generally forms a process chamber 112, wherein the ion beam 104 is generally directed at the workpiece 102 positioned at a workpiece location 114. An ion source 116 for generating positively charged ions from ionizable source materials in the terminal 106 is powered by a power supply 118. The source 116 provides an extracted ion beam 120 to the beamline assembly 108, wherein the ion source 116 comprises one or more extraction electrodes 122 to extract ions from the source chamber and thereby to direct the extracted ion beam toward the beamline assembly 108.

To generate the ions, a dopant gas (not shown) to be ionized is located within a generation chamber of the ion source 116. The dopant gas can, for example, be fed into the chamber from a gas source (not shown). In addition to the power supply 118, it will be appreciated that any number of suitable mechanisms (none of which are shown) can be used to excite free electrons within the ion generation chamber, such as RF or microwave excitation sources, electron beam injection sources, electromagnetic sources and/or a cathode source which creates an arc discharge within the chamber, for example. The excited electrons collide with the dopant gas molecules and ions are generated thereby. Typically, positive ions are generated although the disclosure herein is applicable to systems wherein negative ions are generated as well.

The beamline assembly 108, for example, comprises a beamguide 124 having an entrance 126 proximate to the source 116 and an exit 128 proximate to a resolving aperture assembly 135 within the end station 110. The resolving aperture assembly 135 can include a plasma electron flood (not shown). The plasma electron flood produces neutralizing electrons in a region through which the ion beam passes and will be described in detail with respect to subsequent figures. The ion beam implantation system 100 may include beam forming and shaping structures extending between the ion source 116 and the implantation station end station 110. The beam forming and shaping structures of the resolving aperture assembly 135 maintain the ion beam 104 and bound an elongated interior cavity or passageway through which the beam 104 passes en route to the implantation system end station 110. When operating the implantation system 100, the passageway can be evacuated to reduce the probability of ions being deflected from the predetermined beam path as a result of collisions with gas molecules. The beamguide 124, for example, comprises a mass analyzer 130 (e.g., a mass analysis magnet) that receives the extracted ion beam 120 and creates a dipole magnetic field to pass only ions of appropriate energy-to-mass ratio or range therethrough a resolving aperture 132 to the workpiece 102. The resolving aperture 132 is upstream of various beam forming and shaping apertures (not shown) associated with the beamline assembly 108 may be further provided to maintain and bound the ion beam 104 when the ion beam 104 is transported along a desired beam path 136 to the workpiece 102.

In one example, the desired ion beam 134 is directed toward the workpiece 102, wherein the workpiece 102 is generally positioned via a workpiece scanning system 138 associated with the end station 110. The end station 110 illustrated in FIG. 1, for example, may comprise a "serial" type end station that provides a mechanical scanning of the workpiece within the evacuated process chamber 112, in which the workpiece 102 (e.g., a semiconductor workpiece 102, display panel, or other workpiece) is mechanically translated through the beam path 136 in one or more directions via a workpiece scanning system 138. According to one exemplary aspect of the present invention, the ion implantation system 100 provides the desired ion beam 134 (e.g., also referred to as a "spot beam" or "pencil beam") as being generally stationary, wherein the workpiece scanning system 138 generally translates the workpiece 102 in two generally orthogonal axes with respect to the stationary ion beam 104. It should be noted, however, that batch or other type end stations may alternatively be employed, wherein multiple workpieces 102 may be scanned simultaneously, and such end stations are contemplated as falling within the scope of the present invention. In another example, the system 100 may comprise an electrostatic beam scanning system (not shown) operable to scan the ion beam 104 along one or more scan planes relative to the workpiece 102. In the case of an electrostatic beam the beam shaping or defining aperture would be upstream of the scanner. FIG. 1 further illustrates a scan arm 140 that reciprocates the workpiece 102 through the desired ion beam 134 and a Faraday cup 152, well known by those of skill in the art, for measuring ion beam properties. Accordingly, the present invention further contemplates any scanned and/or non-scanned ion beam 104 as falling within the scope of the present invention. According to one exemplary aspect of the invention, the ion implantation system 100 may comprise the ion implantation system and scanning apparatus described in commonly-owned U.S. Pat. No. 7,135,691 to Vanderpot et al., the contents of which are hereby incorporated by reference. Further, the ion implantation system 100 may comprise other systems such as the Optima HD Scan System manufactured by Axcelis Technologies of Beverly, Mass.

Figure 2:
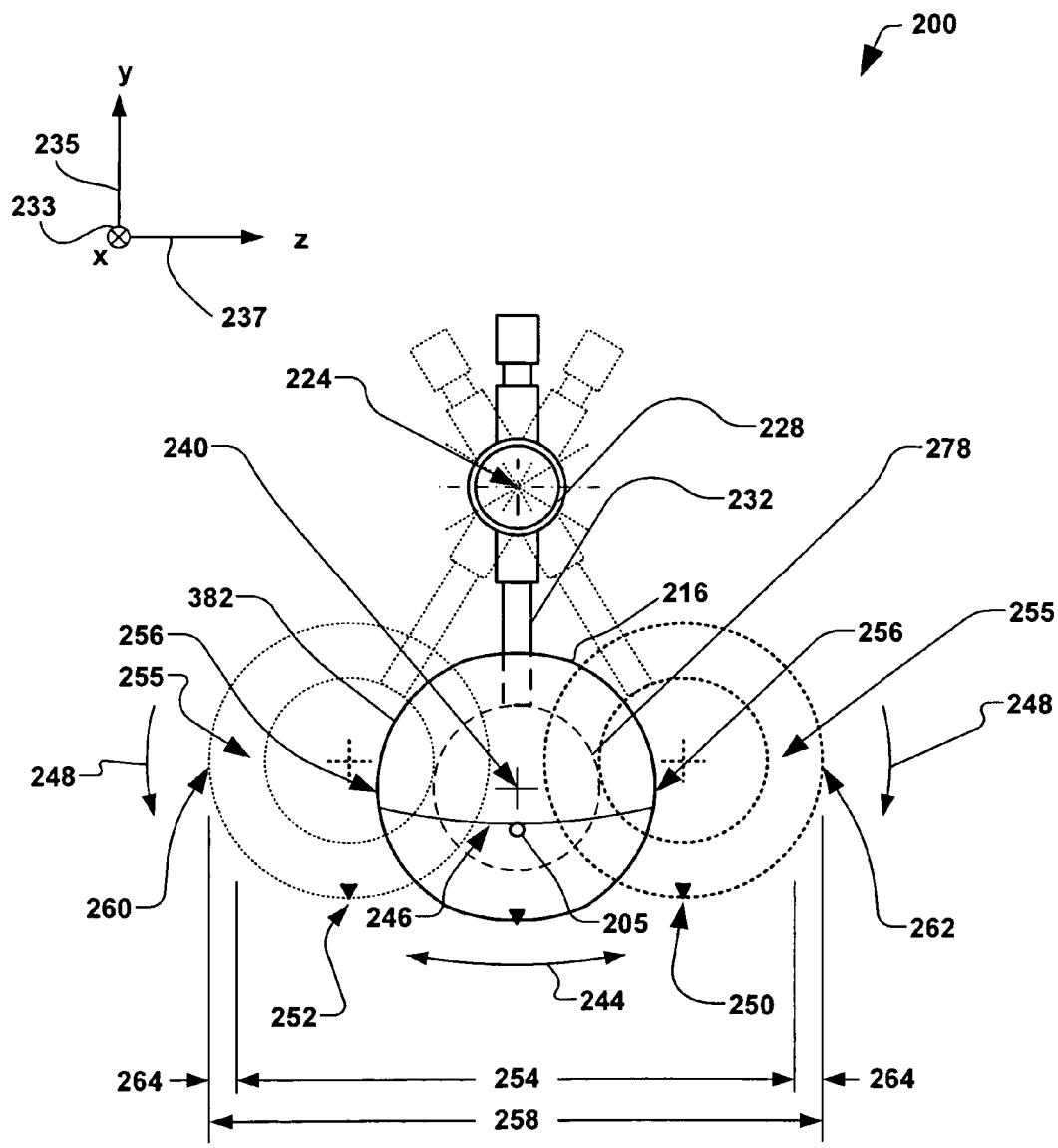
FIG. 2 is a reciprocating drive system illustrating a workpiece mounted to a reciprocating arm in accordance with an aspect of the present invention.

In accordance with another embodiment of the present invention referring now to FIG. 2, illustrated is a reciprocating drive system 200 shown as a front view according to one aspect of the present invention. It will be understood that the exemplary reciprocating drive system 200 of FIG. 2 is operable to scan a workpiece 216 through an ion beam 205 in two dimensions, as will be discussed in greater detail hereafter. According to one exemplary aspect of the present invention, the reciprocating drive system 200 comprises a motor (not shown), wherein the motor is operably coupled to a process chamber (also referred to as an end station), and wherein the process chamber is further associated with the ion beam 205. The ion beam 205, for example, may comprise a group of ions traveling together along close, substantially parallel, trajectories taking the form of a spot or so-called "pencil beam", as may be formed by any suitable ion implantation system (not shown) known in the art, the details of which will not be discussed here.

According to the present invention, the process chamber may comprise a generally enclosed vacuum chamber, wherein an internal environment within the process chamber is operable to be generally isolated from an external environment outside the process chamber. For example, the vacuum chamber can be configured and equipped so as to maintain the internal environment at a substantially low pressure (e.g., a vacuum). The process chamber may be further coupled to one or more load lock chambers (not shown), wherein the workpiece 216 may be transported between the internal environment of the process chamber and the external environment without substantial loss of vacuum within the process chamber. The process chamber may alternatively be comprised of a generally non-enclosed process space (not shown), wherein the process space is generally associated with the external environment.

In one embodiment, the process chamber can be rotated with respect to the external environment. The present invention contemplates any process chamber and process medium operable to be utilized in processing the workpiece 216, whether the process chamber is enclosed, non-enclosed, fixed, or transitory, and all such process chambers and process mediums are contemplated as falling within the scope of the present invention. An example of one type of process chamber is described in U.S. Pat. No. 7,135,691, the contents of which are herein incorporated by reference.

FIG. 2 illustrates the exemplary pendulum reciprocating drive system 200, wherein an exemplary rotation 244 of a shaft 228 about a first axis 224, wherein a scan arm 232, an end effector 278, and a workpiece 216 are further rotated about the first axis 224. Accordingly, the workpiece 216 can be reciprocally translated along a first scan path 246 with respect to an ion beam 205 (e.g., via one or more cyclical counter-rotations of the shaft 228 about the first axis 224), wherein the ion beam 205 is illustrated as going into the page of FIG. 2. The rotation 244 (and/or counter-rotation) of the shaft 228 about the first axis 224 can be advantageously controlled in order to oscillate or reciprocate an end effector 278 along the first scan path 246 in a uniform manner, as will be discussed hereafter. FIG. 2 further illustrates a rotation 248 of the end effector 278 about a second axis 240 as discussed above, wherein the rotation of the end effector 278, and hence, the workpiece 216, about the second axis 240 can be further controlled in order to maintain a rotational orientation of the workpiece 216 with respect to the first axis 224 or ion beam 205 (e.g., rotational orientation of the workpiece 216 with respect to the ion beam 205 extraction electrode is indicated by a triangle 250 that is fixed with respect to the workpiece 216).

In order to evenly process the workpiece 216, such as providing an even implantation of ions into the workpiece 216 from the ion beam 205, it is important to maintain a generally constant translational velocity or controlled articulated motion of the end effector 278 while traveling along the first scan path 246. Maintaining an approximately constant velocity or controlled articulated motion of the end effector 278 while the workpiece 216 passes through the ion beam 205, for example, provides a generally uniform dose of ions to the workpiece 216. Thus even processing of the workpiece 216 is accomplished as it travels along the first scan path 246 in a pendulum-type motion.

Therefore, in another embodiment of the invention, a generally constant velocity or controlled articulated motion is desired for a predetermined scanning range 254 associated with the movement of the workpiece 216 through the ion beam 205. The predetermined scanning range 254 is generally associated with the physical dimensions of the workpiece 216 (e.g., the scanning range is greater than the diameter of the workpiece 216). In the present example, the predetermined scanning range 254 is generally defined by the workpiece 216 traveling a distance greater than a total of the diameter of the workpiece 216 plus a width of the ion beam 205, wherein the workpiece 216 travels through the ion beam 205 along the first scan path 246, and wherein the ion beam 205 is scanned between opposite ends 256 of the workpiece 216.

According to yet another embodiment, a desired velocity profile for the workpiece 216 within the predetermined scanning range 254 may be defined, wherein the desired velocity profile generally depends on a configuration of the reciprocating drive system 200. For example, depending on whether the workpiece 216 is fixed or rotatable with respect to the scan arm 232, a generally constant velocity or a variable velocity of the rotation 244 of the scan arm 232 (and thus, a generally constant or variable velocity of the workpiece 216 along the first scan path 246) may be desired. If, for example, the workpiece 216 is rotated with respect to the scan arm 232 in order to maintain the rotational orientation along the first scan path 246, the rotational velocity of the scan arm 232 about the first axis 224 may be varied when the ion beam 205 nears ends 255 of the predetermined scanning range 254 (e.g., an increase in velocity by about 10% near the ends of the predetermined scan range) in order to provide a generally uniform dose of ions to the workpiece 216 along the curvilinear path. As another alternative, or in addition to varying the velocity of the scan arm 232, properties of the ion beam 205, such as the ion beam current, can be varied in order to produce a generally uniform dosage of ions to the workpiece 216.

As indicated in one of the embodiments above, it is generally desirable for the workpiece 216 to maintain a substantially constant velocity within the predetermined scanning range 254 along the first scan path 246 in order to generally evenly expose the workpiece 212 to the ion beam 205. However, due to the reciprocating, alternately reversing, motion of the workpiece 216 along the first scan path 246, acceleration and deceleration of the workpiece 216 is inevitable, such as between clockwise and counter-clockwise rotations (e.g., counter-rotations) of the shaft 228 about the first axis 224. Therefore, in order to accommodate acceleration and deceleration of the scan arm 232, the end effector 278, and the workpiece 216, a maximum scan distance 258 traveled by the opposite ends 256 of the workpiece 216 between maximum positions 260 and 262 along the first scan path 246 can be further defined. The acceleration and deceleration can occur in overshoot regions 264, either when the ion beam 205 is not in contact with the workpiece 216, or when at least a portion of the ion beam 205 is not in contact with the workpiece 216.

It is important to note that in conventional two-dimensional scanning systems, a permissible amount of acceleration and deceleration during a reversal of workpiece direction is substantially limited in order to minimize inertial forces and associated reaction forces transmitted to the remainder of the conventional scanning system. U.S. Pat. No. 7,135,691 describes a reciprocating drive for scanning a workpiece through an ion beam and is incorporated by reference herein.

Figure 3:
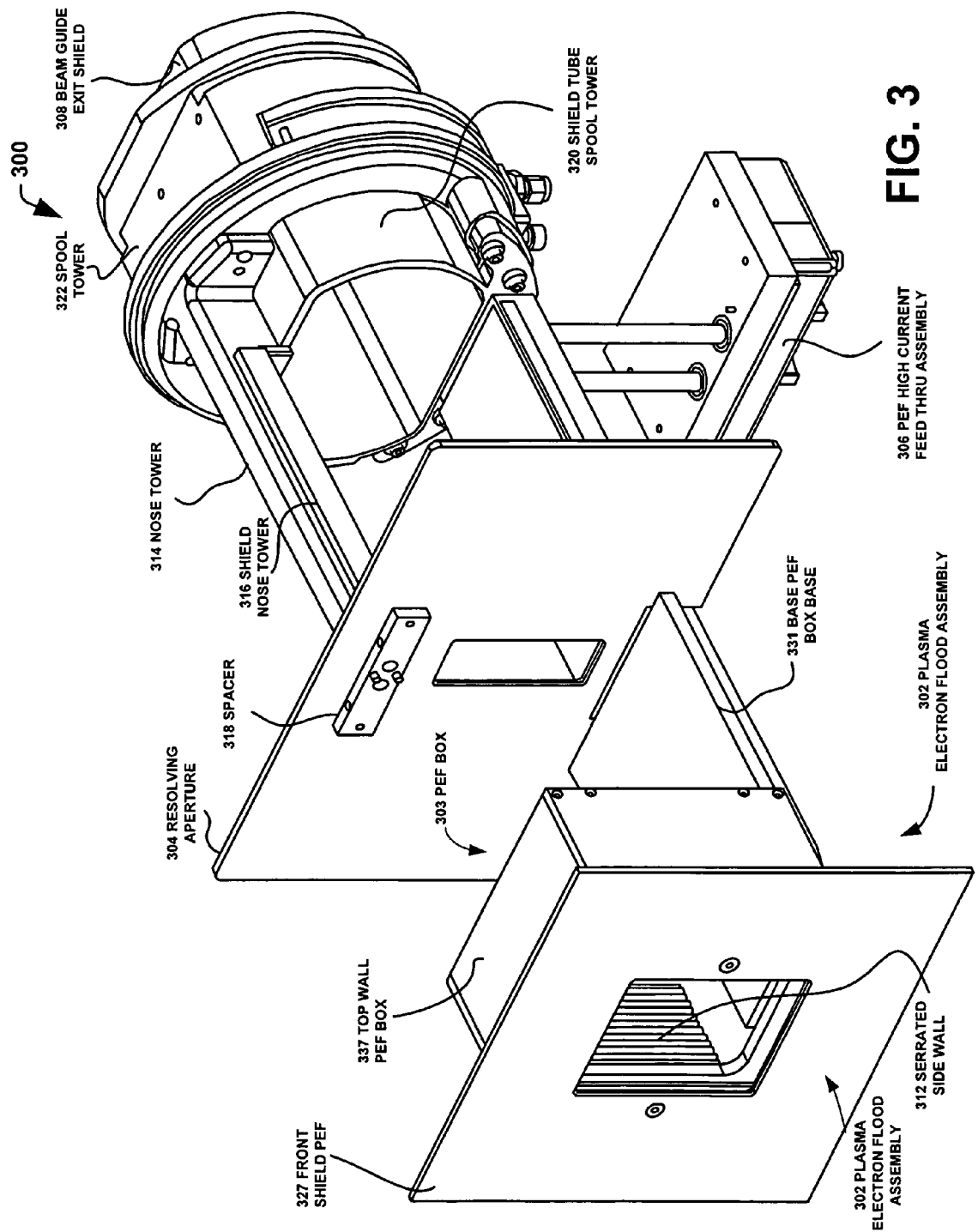
FIG. 3 is a perspective view and an assembly view of a resolving assembly and Plasma Electron Flood (PEF) used in the ion implantation system in accordance with an aspect of the present invention.
Figure 6:
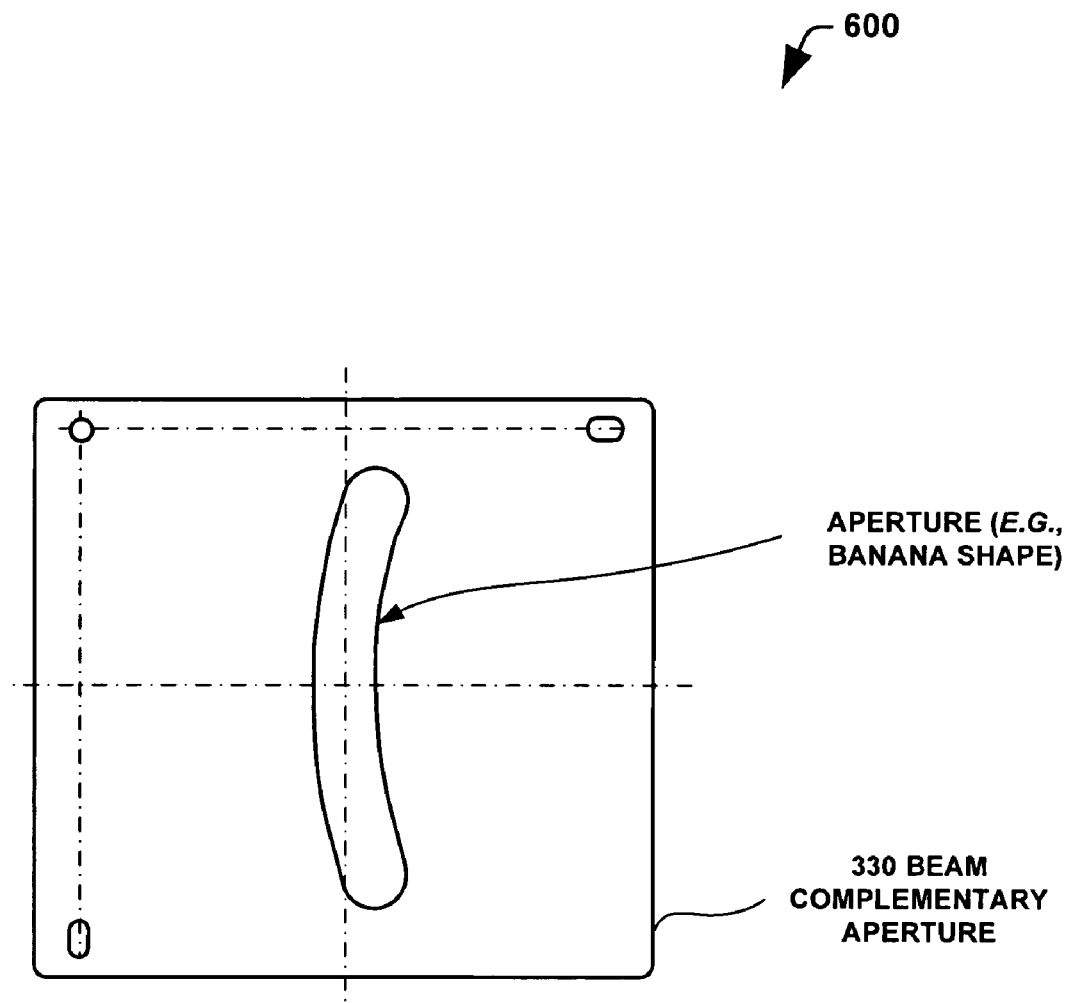
FIG. 6 is a front view of a beam complementary aperture in accordance with an aspect of the present invention.

Referring to FIGS. 1, 3, 4A, 4B, 5A and 5B are various exploded and perspective views illustrating a resolving assembly 300 utilized in an ion implantation system 100 employing a mass analyzer (not shown) for mass analysis and angle correction in accordance with an aspect of the present invention. The resolving assembly 300 in FIG. 3 is provided as an example and it is appreciated that other variations and configurations can be employed for alternate aspects of the invention.

Although not shown, a quadrupole lens or other focusing mechanism can be positioned downstream of the mass analyzer 130 (FIG.1) to compensate or mitigate the impact of beam blow up upon the ion beam 104 (FIG. 1). An event which commonly results from the ion implantation process is workpiece 102 charging, in which positive ions from the ion beam 104 strike the workpiece 102 and accumulate in the masking layer. This can cause an excessive charge buildup on the workpiece 102, leading to charge imbalances in the ion beam 104 and the condition known as beam blow-up, which results in variations in ion distribution across the workpiece 102. The excessive charge buildup can also damage surface oxides, including gate oxides, leading to device reliability issues, result in electrical breakdown of insulating layers, etc., within the workpiece 102 and lower device yield.

FIG. 3 illustrates a perspective view of the resolving assembly 300 (illustrated as assembly 135 in FIG. 1) according to at least one embodiment of the invention. The resolving assembly 300 will not be described in great detail as resolving assemblies are well known to those of skill in the art. The resolving assembly includes plasma electron flood (PEF) assembly 302. Workpiece 102 charging can be controlled using the plasma electron flood (PEF) assembly 302, in which the workpiece 102 is subjected to a stable, high-density plasma environment.

Suitable equipment for generating and transporting an ion beam through a charge neutralization system to an implantation station are disclosed, for example, in U.S. Pat. No. 5,164,599 issued to Benveniste, U.S. Pat. No. 5,531,420 issued to Benveniste, U.S. Pat. No. 5,633,506 issued to Blake, U.S. Pat. No. 5,691,537 issued to Chen et al., and U.S. Pat. No. 5,703,375 issued to Chen et al.

An arc chamber (not shown) can be situated below the plasma electron flood (PEF) assembly 302 attached to a PEF box base 331 (FIG. 5), as illustrated. The arc chamber can contain a filament, a gas introduction port, and an arc chamber PEF cover 339 (FIG. 5), wherein the cover 339 with an extraction hole exposes the arc chamber to the inner surface of a PEF box. It is to be appreciated that the resolving assembly 300 can be made in different configurations and all such configurations are contemplated herein. The embodiment shown should not be interpreted in a limiting sense to embodiment shown.

Low-energy electrons are extracted from plasma in the arc chamber and introduced into the ion beam 104, which carries the electrons to the workpiece 102 so that surface charges on the workpiece 102 are neutralized. The energy of the electrons is sufficiently low to prevent negative charging of the workpiece 102.

The plasma electron flood (PEF) assembly 302 for neutralizing positive charges on the ion-implanted workpiece 102 includes a PEF box 303 having serrated side walls 312 to thereby prevent adhesion of insulating stains to the entire surfaces of the inner walls but rather attach to a portion of the walls. The PEF box 303 defines an interior region 222 through which ion beam 134 (FIG. 1) passes from ion beam source 116 to the process chamber 112, as illustrated in FIG. 1.

At least one embodiment of the resolving assembly 300, illustrated in perspective view, is positioned between the exit 128 (FIG. 1) of the mass analyzer 130 and the process chamber 112 and comprises the plasma electron flood (PEF) assembly 302, a resolving aperture 304, a PEF high current feed through assembly 306, an insulator PEF fitting 307, a beam guide exit shield 308 and a beam guide exit aperture 310 (FIG. 4A).

The resolving assembly 300 further comprises a nose tower 314 that is partially surrounded by a nose tower shield 316 and the nose tower 314 connects to the resolving aperture 304 through a spacer 318 that bolts to the resolving aperture 304 and the nose tower 314. A shield tube spool tower 320 is arranged coaxially inside the spool tower 322 and is held in place mechanically and the t-end of the nose tower is bolted to the spool tower 322. An o-ring 324 (FIG. 4A) is positioned and secured between the spool tower 322 and a tower ring diaphragm mount 326. The beam guide exit aperture 310 fits into the distal end of the spool tower 322 along with the beam guide exit shield 308.

A front shield PEF 327 can be connected to a front shield spacer PEF 329 and the serrated side walls 312 are attached to the base PEF box base 331, the top wall PEF box 337 and a back shield spacer PEF 335 utilizing fasteners comprising screws and the like. The beamline exit aperture PEF (e.g., graphite) or beam complementary aperture 330, a key component of the invention can be connected to the back shield spacer PEF 335, so that it is properly positioned in the resolving assembly 300.

The inventors recognized that by utilizing a beam complementary aperture 330 that closely corresponds to the beam shape (e.g., a "banana shape") that the number of particles and contamination could be greatly reduced. In this case the aperture size and shape is fixed. There exist typical methods to measure the ion beam cross-sectional envelope comprising a cross-section of the ion beam that impacts a plane that is perpendicular to the ion beam path. This can be accomplished utilizing a system with segmented detectors that are swept through the beam both vertically and horizontally. In an alternative method it can be done with spinning a spiral hole that is patterned in a plate through the beam which provides an image in both dimensions. In yet another approach, the image can be determined by simple beam burns on a suitable material and the edges of the beam can also be detected by moving floating apertures into the proximity of beam. It should be appreciated by one skilled in the art that the ion beam complementary aperture 330 can be used in many implantation products and systems. For example, with ion ribbon beam or scanned ion beam implanters the beam complementary aperture 330 would be used upstream of the collimator or scan system 138 (FIG. 1). It should also be appreciated that the beam complementary aperture 330 can comprise various shapes and sizes and all are contemplated herein.

In another embodiment the ion beam shape and size can be determined utilizing a variable an/or electromechanical system comprising sensors and a control system, an in-situ dynamically controlled variable aperture (not shown) that detects the edges of the beam by measuring electrical currents intercepted by the beam complementary aperture and the like. In this embodiment the variable ion beam complementary aperture (not shown) can be configured to adjust the aperture to approximate the ion beam shape and size.

The beam defining aperture 132 at the exit of the mass analyzer 130 is designed such that its acceptance is matched to the emittance of a beam originating from an ion source as a slit with narrow width and relatively tall height, passing through a set of optical elements such as electromagnets that produce aberrations within the beam. The aberrations are, for example, caused by a gradient in a magnetic field through which the ion beam travels such that the radius of curvature of the trajectory of individual ions in the beam varies. As another example a field gradient in the tall direction of the slit beam, such as caused by a source magnetizing or mass analysis dipole with large pole gaps, will result in a beam whose position in the dispersive direction will shift as a function of position in the non-dispersive direction, so that the resulting beam shape appears curved towards the center of gyration of the ion beam in the dipole field.

Ideally the opening of the beam complementary aperture 330 (e.g., banana aperture) will be matched to the shape of the ion beam and minimum beam strike on the aperture occurs. In contrast, previous systems have not taken into account these beam shapes and are designed with rectangular mass resolving beam apertures. These apertures will excessively or unevenly clip the beam simply due to the mismatch in geometries. Therefore the beam complementary aperture 330 can be designed to match the emittance and provide the optimum amount of beam clipping. It is to be appreciated that the beam complementary aperture 330 can be sized and shaped to match any ion beam shape and size as known by one of skill in the art. Further, the beam complementary aperture 330 or other beam defining apertures can be designed in a variable electromechanical embodiment that allows for in-situ tuning of the aperture size to closely match the actual beam size that was discussed supra.

This method of beam size control is useful to improve process throughput by reducing the necessary workpiece over scan and also limits the beam size to prevent unwanted beam strike in the process chamber area. In addition to the beam limiting function, resolving and defining apertures can clip charged particles which become entrained in the envelope of the ion beam. This clipping of the edges can therefore block the entrained particles and reduce the amount of particles which are transported to the target chamber. Lastly, excessive beam strike utilizing conventional resolving and beam defining apertures can create sputtered material and generate secondary electrons. The sputtered material may create additional particles and/or release contamination from a previously run specie. The resolving and beam defining apertures are therefore designed to balance the tradeoff of providing sufficient mass resolution, beam current, particle clipping while minimizing sputtered material. In this embodiment, the radius and length of the banana shape, for example, have been constructed such that minimum beam loss occurs at operation greater than 20 keV, for example.

Figure 7:
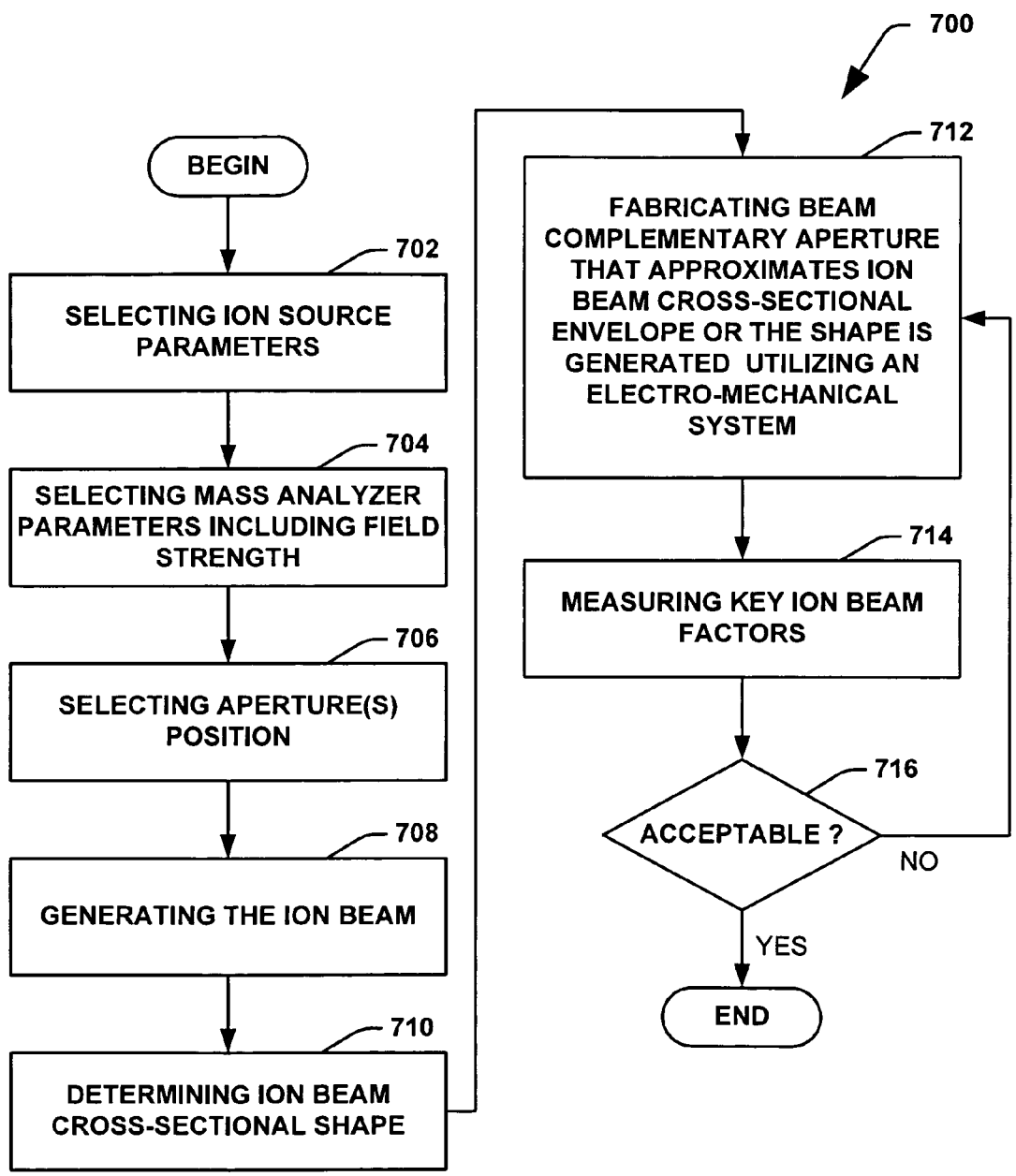
FIG. 7 is a flow diagram of a method of adjusting the beam complementary aperture size and shape in the ion implantation system in accordance with an aspect of the present invention.

In accordance with yet another aspect of the present invention, a method of reducing particles and contamination by matching a beam complementary aperture size and shape to the ion beam size and shape is provided, as illustrated in FIG. 7 and designated as reference numeral 700. Although the methodology 700 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention.

Furthermore, the methodologies according to the present invention may be implemented in association with the formation and/or processing of structures illustrated and described herein as well as in association with other structures not illustrated.

The method will now be described with reference to other FIGS. 1-3, 4A, 4B, 5A, 5B and 6. The method 700 begins at 702 with selecting ion beam source parameters within the ion source 116 (FIG. 1), for example. An ion beam 104 is extracted at 702 and directed toward a mass analyzer 130 (FIG. 1). The ion beam 104 can be a pencil beam, a divergent beam, a ribbon beam, and the like. At 704 the mass analyzer 130 (FIG. 1) parameters are selected, such as magnetic field strength and the like.

At 706 the aperture positions are selected, other than a beam complementary aperture 330 in the ion implantation system 100. This allows the generated ion beam 104 at 708 to travel through the ion implantation system 100 so that at 710 the size and cross-sectional shape of the ion beam 104 can be measured and accurately determined at the end station 110. In this embodiment the beam complementary aperture 330 is a fixed or constant size and shape. It will be appreciated that in this embodiment the shape is a banana shaped aperture 600, however the aperture 600 can be fabricated to match the size and cross sectional shape of any ion beam. As discussed supra there exist typical methods to measure the ion beam cross-sectional envelope comprising a cross-section of the ion beam that impacts a plane that is perpendicular to the ion beam path. This can be accomplished utilizing a system with segmented detectors that are swept through the beam both vertically and horizontally. In an alternative method it can be done with spinning a spiral hole that is patterned in a plate through the beam which provides an image in both dimensions. In yet another approach, the image can be determined by simple beam burns on a suitable material and the edges of the beam can also be detected by moving floating apertures into the proximity of beam.

In yet another embodiment the variable beam complementary aperture (not shown) is configured so that the aperture size and shape is adjustable. The ion beam shape can accurately be determined utilizing an electromechanical system comprising sensors and a control system, an in-situ dynamically controlled variable aperture (not shown) that detects the edges of the beam by measuring electrical currents intercepted by the beam complementary aperture and the like. At 912 the beam complementary aperture 330 is fabricated that corresponds to the ion beam cross-sectional shape or the aperture shape is generated through the electromechanical system configured to adjust the aperture so that it corresponds to the ion beam 104 cross sectional shape and size. At 714 the key ion beam factors are measured and if they are unacceptable the method 700 returns to 712, otherwise the process ends. The key ion beam factors comprise beam current, particle contamination and the like.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. The term "exemplary" as used herein is intended to imply an example, as opposed to best or superior. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system comprising:
   an ion source configured to generate an ion beam having a first cross-sectional shape along a beam path;
   a mass analyzer positioned downstream of the ion source along the beam path, wherein the mass analyzer is configured to mass analyze the ion beam, and wherein the mass analyzer is further configured to produce aberrations within the ion beam, therein defining a second cross-sectional shape of an emittance ion beam emitted from the mass analyzer; and
   a beam complementary aperture positioned downstream of the mass analyzer along the beam path, wherein the beam complementary aperture has a shape corresponding to the second cross-sectional shape of the emittance ion beam,
   wherein the second cross-sectional shape is generally banana-shaped.

2. The ion implantation system of claim 1, further comprising a resolving aperture positioned upstream of the beam complementary aperture.

3. The ion implantation system of claim 1, further comprising a plasma electron flood assembly, wherein the beam complementary aperture is positioned within the plasma electron flood assembly.

4. A method of reducing contamination associated with an implantation of ions into a workpiece, the method comprising:
   forming an ion beam having a first cross-sectional shape along a beam path; mass analyzing the ion beam, therein producing aberrations within the ion beam;
   measuring a second cross-sectional shape of an emittance ion beam emitted from the mass analyzer; and
   positioning a beam complementary aperture along the beam path downstream of the mass analyzer, wherein the beam complementary aperture has a shape corresponding to the second cross-sectional shape of the emittance ion beam;
   wherein the second cross-sectional shape is generally banana-shaped.

* * * * *